(12) United States Patent
Kim et al.

(10) Patent No.: US 6,927,482 B1
(45) Date of Patent: Aug. 9, 2005

(54) SURFACE MOUNT PACKAGE AND METHOD FOR FORMING MULTI-CHIP MICROSENSOR DEVICE

(75) Inventors: Woojin Kim, Pleasanton, CA (US); John Dancaster, San Ramon, CA (US); John Logan, Danville, CA (US); Aniela Bryzek, Hayward, CA (US)

(73) Assignee: General Electric Company, Plainville, CT (US)

( * ) Notice: Subject to any disclaimer, the term of this patent is extended or adjusted under 35 U.S.C. 154(b) by 0 days.

(21) Appl. No.: 10/605,472

(22) Filed: Oct. 1, 2003

(51) Int. Cl.[7] .............................................. H01L 23/495
(52) U.S. Cl. ...................... 257/670; 257/678; 257/680; 257/666
(58) Field of Search ................................ 257/670, 666, 257/678, 433, 434, 444

(56) References Cited

U.S. PATENT DOCUMENTS

| | | | |
|---|---|---|---|
| 4,838,089 A | 6/1989 | Okada et al. ................. 73/727 |
| 5,491,360 A * | 2/1996 | Lin ............................. 257/672 |
| 5,598,038 A * | 1/1997 | Sugano ........................ 257/787 |
| 5,901,046 A | 5/1999 | Ohta et al. ................... 361/760 |
| 5,912,556 A | 6/1999 | Frazee et al. ............. 324/207.2 |
| 6,297,552 B1 * | 10/2001 | Davis et al. ................. 257/723 |
| 6,414,388 B1 * | 7/2002 | Moriyama .................... 257/724 |
| 6,433,424 B1 * | 8/2002 | Sammon ...................... 257/735 |

FOREIGN PATENT DOCUMENTS

EP             0409196 A2 *   7/1990        H01L/25/18

* cited by examiner

Primary Examiner—Jasmine Clark
(74) Attorney, Agent, or Firm—Dykema Gossett PLLC

(57) ABSTRACT

A surface mount package for a multi-chip device has a leadframe formed with first and second die pads and lead-outs from the respective die pads. An environmentally responsive sensor chip is secured to the first die pad and an environmentally isolated chip is secured to the second die pad. The chips are electrically coupled through the lead frame. A body formed with an over molded portion encases the isolated chip and an open molded portion formed with a recess receives the environmentally sensitive chip. An apertured cover is secured in the recess to form a protective covering over the sensor chip and for allowing communication of the sensor chip externally of the package.

5 Claims, 7 Drawing Sheets

SURFACE MOUNT PACKAGE AND METHOD FOR FORMING MULTI-CHIP MICROSENSOR DEVICE

BACKGROUND OF INVENTION

The invention pertains to sensor packages, and particularly to a tire pressure sensor employing semiconductor chips in a protective housing.

Tire pressure monitoring systems (TPMS) monitor the pressure in automotive tires. TMPS provide a safety warning to alert the driver of low tire pressure. In addition, tire pressure monitoring provides information to the driver/owner, which encourages maintenance of even tire pressure. This results in better fuel economy and extended tire life.

TMPS employ a number of components to sense and transmit data to the driver. The components are typically separated by function. One such component comprises a pressure sensor for sensing tire pressure and providing data outputs indicative thereof. An application specific integrated circuit (ASIC) responsive to temperature and system battery voltage processes the data outputs and communicates the data to a receiver for display on the instrument panel.

Known systems have been packaged in a variety of ways. One such system over-molds or encapsulates the pressure sensor and ASIC in a single sealed package. Another system locates the pressure sensor and ASIC in an open chamber on a circuit board. These arrangements have shortcomings which interfere with performance or increase cost or both.

Available TMPS have sensor packages with existing leadout arrangements. These systems require a compatible or uniform package configuration. Also, new leadout arrangements are desired for alternative arrangements.

SUMMARY OF INVENTION

The invention is based on the discovery that components for a tire pressure monitoring system (TMPS) may be packaged on a common leadframe within an integrated circuit package in which the ASIC is over-molded and rendered insensitive or isolated to the local environment, and the sensor is interfaced with the ASIC in open cavity having a cover and pressure transfer aperture. The package has readouts which are compatible with existing standardized TMPS.

In a particular embodiment, the invention is a surface mount package for a multichip device having at least one environmentally sensitive device or sensor chip, and at least one environmentally insensitive device or ASIC chip secured on a common leadframe in a molded body. The molded body includes an over-molded portion for encapsulating the ASIC and isolating it from environmental effects; and an open molded recess portion or open cavity for receiving the sensor chip therein. The leadframe, having a tie bar and lateral dam bars, is secured in the package between the chips and has a die pad for receiving the ASIC for mounting and a die pad for receiving the sensor for mounting. The ASIC and pressure sensor are wirebonded to selected leads on the leadframe. Certain leadframe leads are commonly wirebonded to the sensor and ASIC thereby interconnecting the chips. These leadframe leads are not directed to the dam bar side, but to the tie bar side, and then trimmed out. The arrangement allows for a reduced package size and a number of readouts compatible with available TMPS. The leadframe and sensor chip are overmolded and the sensor is encapsulated in a flexible material which enables the sensor to be responsive to pressure. The recess has an aperture cover disposed over the opening to close the chamber. The leadframe is singulated by severing a tiebar and dam bar between untrimmed leadframes after molding the body. In a particular embodiment the die pad for the sensor is located in a plane offset from the die pad of the ASIC.

DETAILED DESCRIPTION

Figure 1:
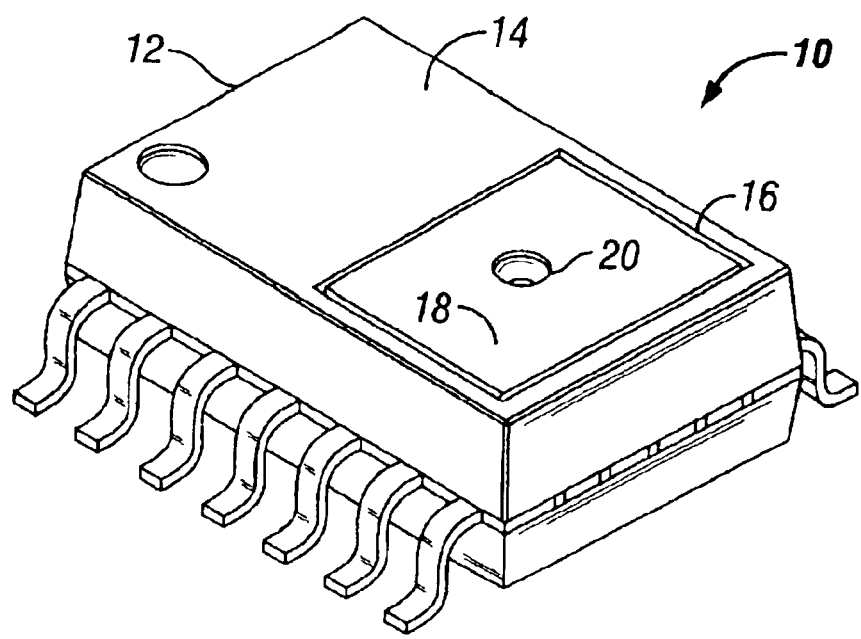
FIG. 1 is a perspective view of the overall arrangement of the sensor package according to the invention.
Figure 2:
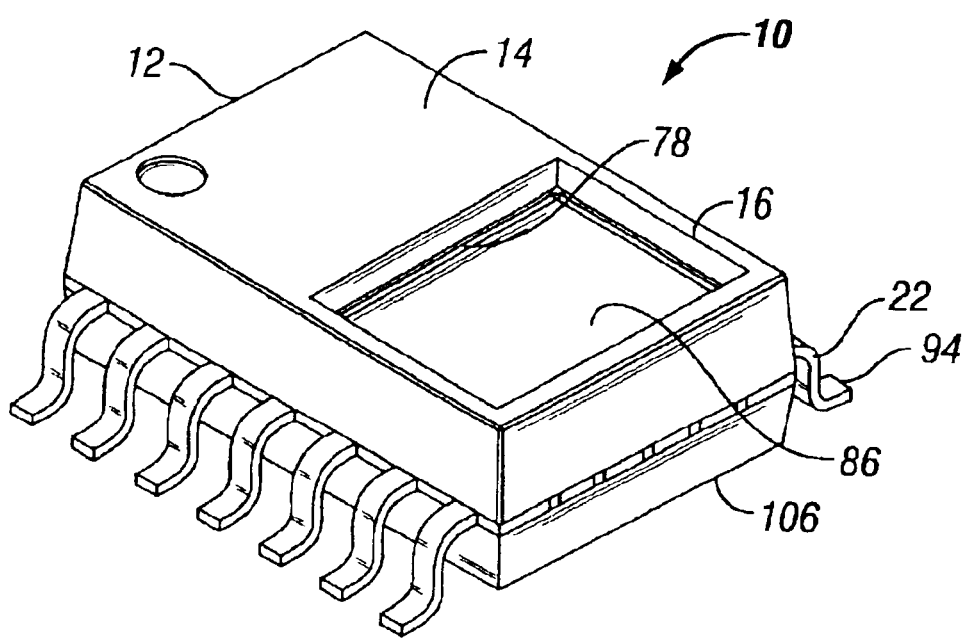
FIG. 2 is a perspective view with the sensor cover removed.
Figure 3:
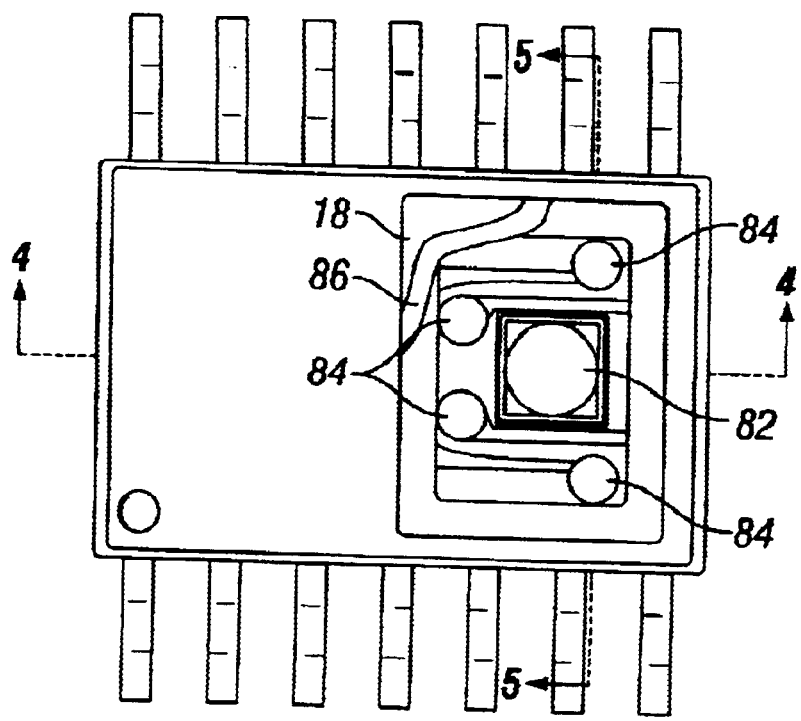
FIG. 3 is a fragmentary top plan view of the sensor package shown in FIG. 1.
Figure 4:
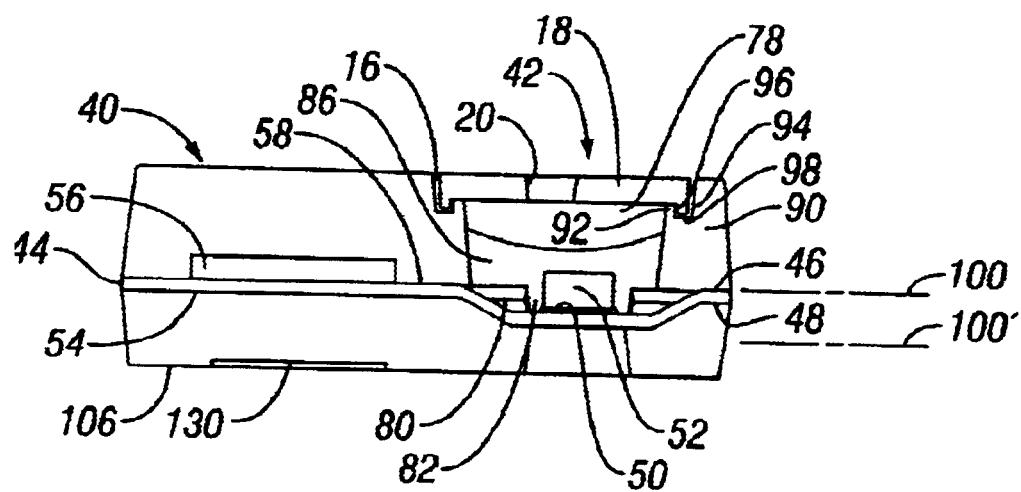
FIG. 4 is a sectional view of the package taken along line 4—4 of FIG. 3.
Figure 5:
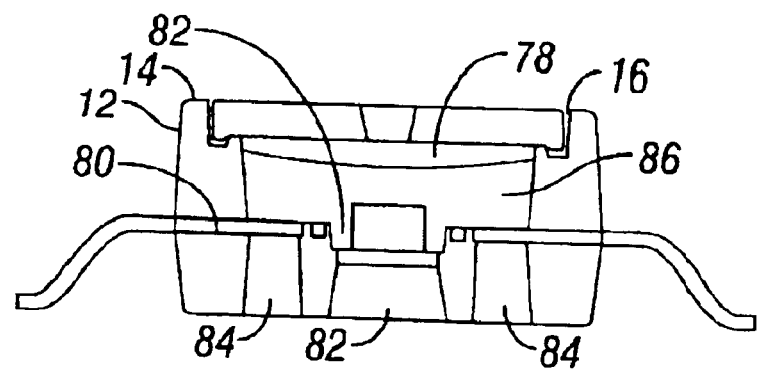
FIG. 5 is a sectional view of the package taken along line 5—5 of FIG. 3.

As illustrated in FIG. 1, the invention comprises a sensor package 10 for use in a tire pressure measurement system (TMPS), not shown. The package 10 includes a body 12, having an upper surface 14 and an opening 16 formed therein. The opening has an apertured cover 18 located therein. The apertured cover 18 has a hole 20 formed therein. The package 10 has lead-outs 22 which extend outwardly of the body 12 from the lateral sides as shown. The configuration of the lead-outs 22 is a standardized arrangement.

Figure 9:
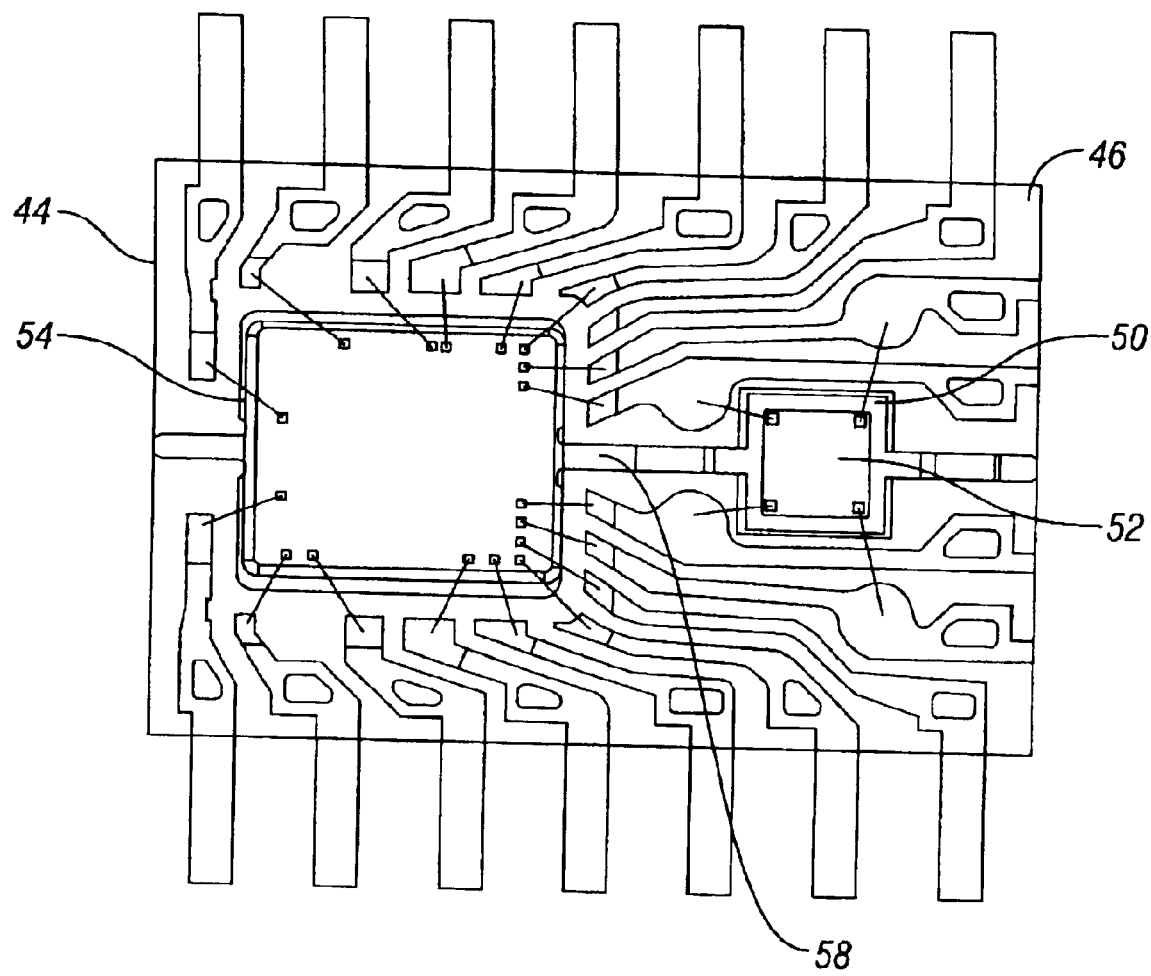
FIG. 9 is a plan view of the leadframe employed in the package according to the invention.

As further illustrated in FIGS. 2–7, the body 12 of package 10 includes an over-molded or closed portion 40 and open portion 42. A leadframe 44 is over molded within the body. The leadframe 44 has respective upper and lower surfaces 46 and 48; a die pad 50 for supporting a pressure sensor chip 52 on the upper surface 46; and a die pad 54 for supporting an application specific integrated circuit (ASIC) 56 on the upper surface 48. The die pads 50 and 54 are commonly connected by lead element 58 (FIG. 9). As illustrated in fig. 80., the ASIC 56 may be optionally mounted on the lower surface 46 if desired.

Trimmed the leadframe 44 is shown in FIG. 9. The untrimmed leadframe 44, shown in FIG. 10, has tie bar 60; laterally disposed dam bars 62, and inboard contact leads 64 connected to the readouts 22, as shown. The sensor 52 and the ASIC 56 have respective contacts 66 and 68 which are wirebonded by respective wirebonds 70 and 72 to selected ones of the contact leads 64 as shown. The contacts 66 of the sensor 52 are commonly coupled to selected ones of the contacts 68 on the ASIC by wirebonds 72 and interconnected portions 74 of the contact leads 64, as shown. In this way, the sensor 52 and ASIC 56 are electrically interconnected.

In some conventional overmolded systems, the sensor contacts 66 and ASIC contacts 68 are directly connected by wirebonds. The arrangement results in the number of lead-outs 22 shown. In order to conform the package of the invention to the size and lead out configuration of at least one conventional system, selected ones of the inboard contact leads 64 are used to interconnect the ASIC and sensor chips and at the same time allow for isolation of the ASIC and sensor.

As illustrated in FIGS. 2–5, the body 12 has a recess 78 formed therein which extends from the opening 16 in the upper surface 14 to a lower wall 80 having an aperture 82 formed therein, centered on the die pad 50. The sensor chip 52, secured to the die pad 50 is located in the aperture 82 as shown. Apertures 84 are formed in the body which are discussed hereinafter.

A flexible encapsulating gel 86 is deposited over the sensor 52 to protect the device. In the exemplary embodiment discussed herein, the sensor 52 is responsive to ambient pressure. The encapsulating gel 86, which may be a conventional silicone material, is sufficiently flexible to allow the sensor 52 to be responsive to changes in ambient pressure.

The opening 16 is formed with an offset 90 having an upstanding ridge 92 forming a channel 94. The cover 18 has an outer edge 96 which mates with the channel 94. An appropriate adhesive 98, e.g. epoxy sealant, is disposed in the channel 94 to secure the cover 18 in the opening 16. The aperture 20 in the cover 18 is sized for allowing the sensor 52 to communicate with the environment exterior of the package 10 and at the same time to prevent infiltration of contaminants into the chamber 78.

Figure 10:
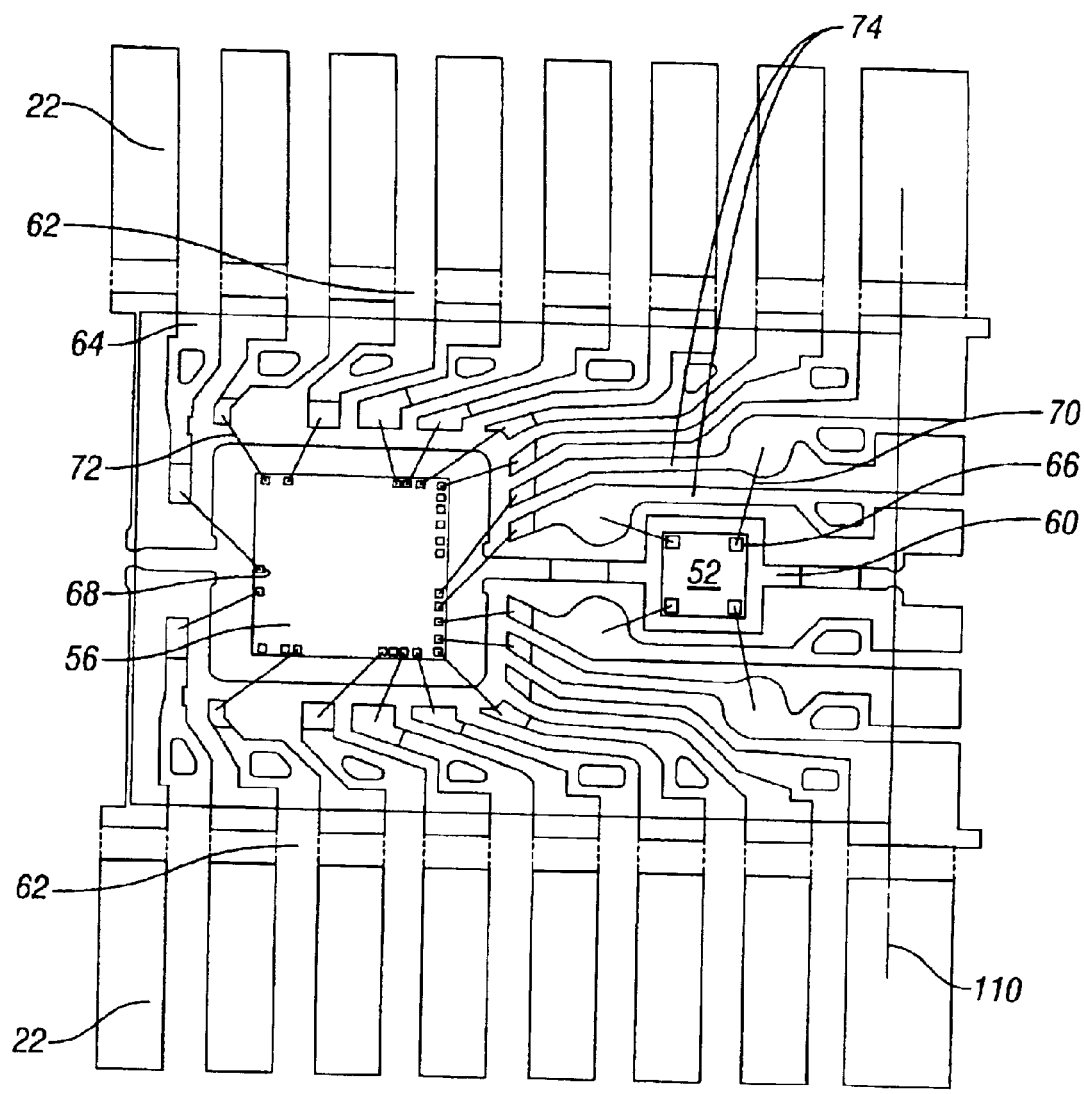
FIG. 10 is a plan view of the leadframe as it appears prior to trimming.

FIGS. 9 and 10 illustrate the leadframe 44. It should be understood that the leadframe 44 is typically formed from a metal ribbon wherein a plurality of leadframes are joined end-to-end along the tie bar 60 and laterally along the dam bar 62. When the package of the invention is formed, as discussed below, the selected portions of the leadframes are removed and the packages are singulated.

The ASIC 56 is responsive to temperature and system battery voltage. The ASIC 56 is secured to the die pad 54 of the leadframe 44 and is over-molded therewith during fabrication of the package. The over-molded or closed portion 40 of the package 10 isolates the ASIC from the environment, yet allows it to be responsive to temperature excursions. As noted above, the inboard contact leads 64 of leadframe 44; the lead element 54; and the wirebonds 70 and 72 electrically couple the sensor 52 and the ASIC 56 to each other and to the readouts 22.

The leadframe 44 is generally planar in configuration and lies in a plane 100 within the body 12 near a mid-plane thereof. The die pad 50, supporting the sensor chip 52 is offset from the plane 100. The die pad 50 is attached to the leadframe 44 by integral lead portions 102 which are deformed as shown to position the die pad 50 in a plane 100' offset from the plane 100 of the leadframe 44. As a result, the package height is minimized, and the package weight is likewise minimized. Such minimization of the package size and weight is advantageous in the environment of an automobile tire where the TPMS is located.

Fabrication of the package 10 is accomplished as follows. The ASIC chip 56 may be secured to the respective die pad 54 of the leadframe 44. Wirebonds 72 are attached from the ASIC contracts 68 to corresponding inboard contact leads 64.

Thereafter, the package body 12 may then be formed by over molding the ASIC 56 and leadframe 44, thereby producing the over moulded portion 40 and open portion 42. The sensor chip 52 is then mounted to the die pad 50 inside the open chamber 78 through the opening 16 and recess 82. The contacts 66 of the sensor 52 are wire bonded by wirebonds 70 to common leads 74 as shown. Silicone gel 86 is deposited in the chamber 78 over the sensor 52, and the cover 18 is secured in the opening 16 using epoxy sealant 98.

After the body is assembled, the sensor package is singulated, In untrimmed form, the leadframe 44, shown in FIG. 10, has tiebar 60 and dam bars 62 which hold the leadframe and various metal contact surfaces in alignment prior to assembly of the package. After the leadframe 44 is assembled in the body 12, bodies are singulated in a known manner.

The readouts 22 may then be deformed to produce distal ends 94 for connection to external circuitry. The distal ends 94 are arranged so as to be positioned immediately adjacent to the under side 106 of the body 12 generally coplanar therewith as shown.

In the exemplary embodiment, tie bar 60 is trimmed along line 110, and a selected number of fourteen readouts 22 are formed on the lateral sides of the body by trimming between the lead outs 22, as shown, whereby the package of the invention has pin compatibility with known systems.

Figure 11:
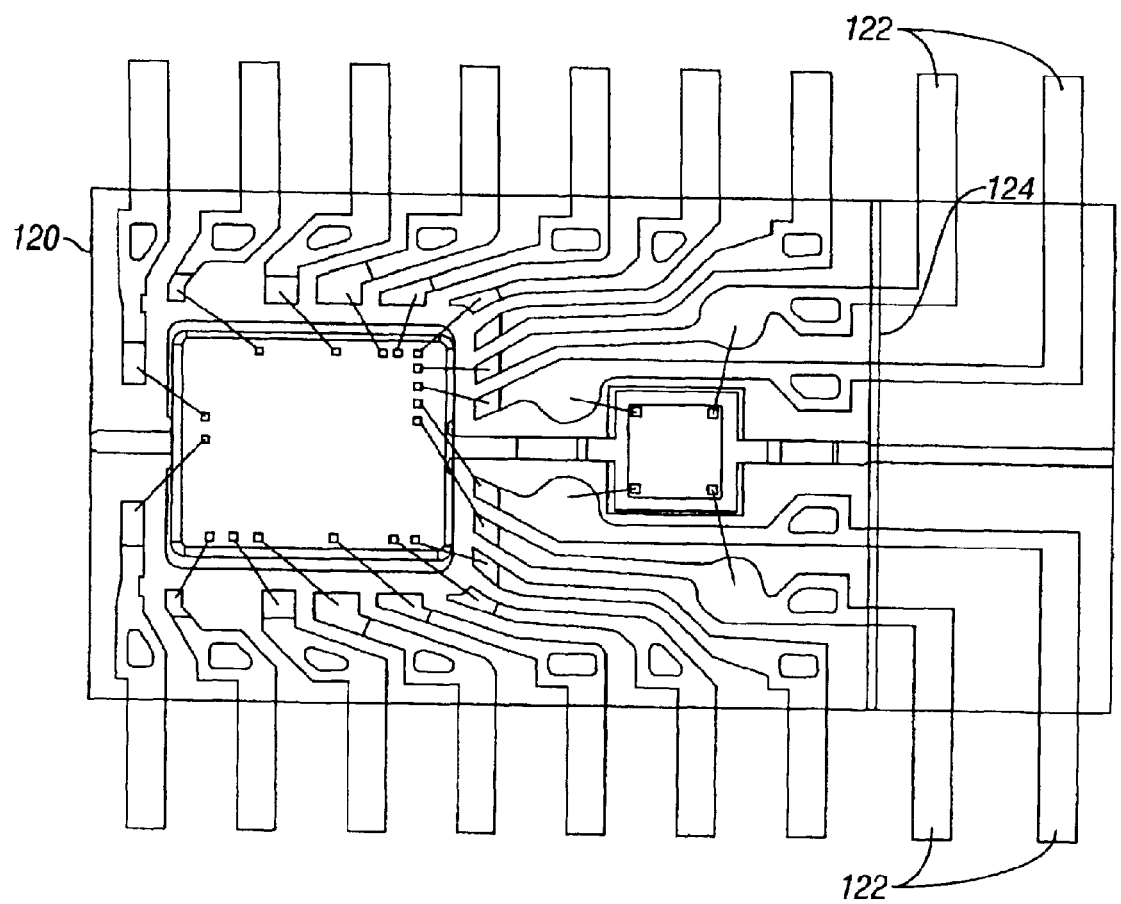
FIG. 11 is a plan view of an alternative arrangement showing a lead frame having additional leadouts after trimming.

An alternative arrangement is shown in FIG. 11, wherein the leadframe 120 has additional readouts 122 extending from the end 124 of the leadframe and directed to the dam bar side. This arrangement increases the lead count from fourteen to eighteen with an increase in package size.

The dotted lines indicate the trimming process. The process includes (1) lead length cut and dam bar removal, (2) singulating; trimming the tie bar and the 4 sensor leadouts, and (3) lead forming. As noted, the additional leadouts may be optionally formed as well.

The process for manufacturing the package according to the invention employs conventional molding techniques wherein a plurality of leadframes are provided. The die pad 50 is offset from the plane 100 of the leadframe 44. Thereafter the chips are attached to the corresponding die pads as discussed above. The wirebonds are then attached to the chips and contacts. Thereafter, the package is secured in a mold cavity, not shown, and held in position during transfer molding of the body. During the molding process, the leadframe is held in position by contact devices, not shown, and which contact devices result in the formation of ejector pin apertures 82, 84 and 130 in the body discussed below. These apertures, necessitated by the molding process, are positioned so as to have no effect on the integrity of the package 10, or to adversely effect the sensitivity of the sensor.

Figure 6:
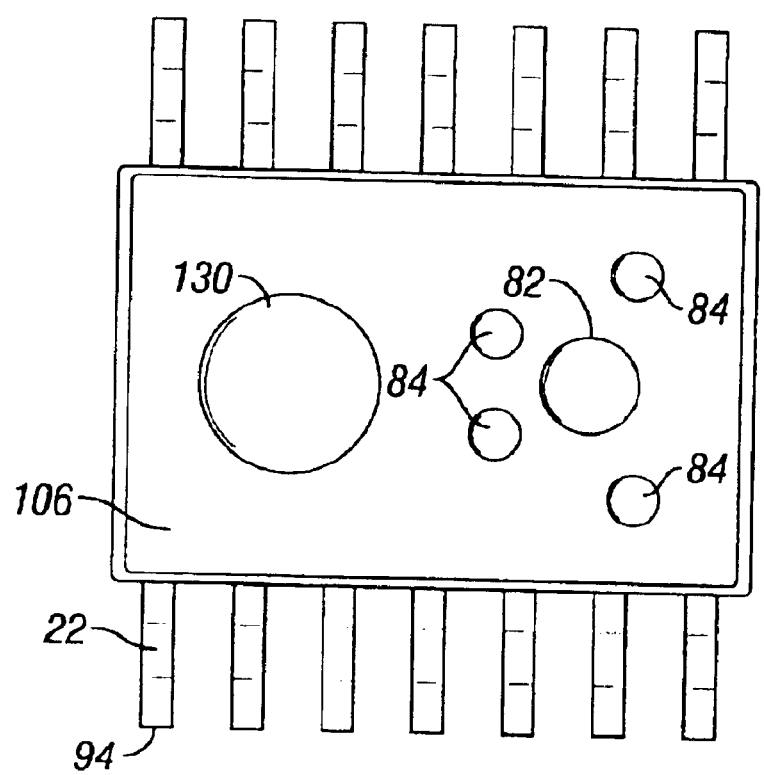
FIG. 6 is a button view of the sensor package shown in FIG. 1.
Figure 7:
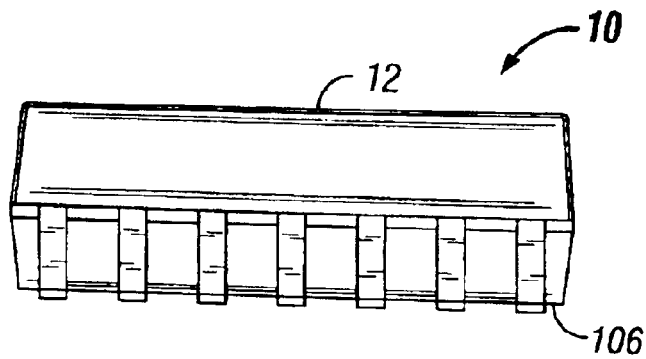
FIG. 7 is a side elevation of the sensor package shown in FIG. 1.
Figure 8:
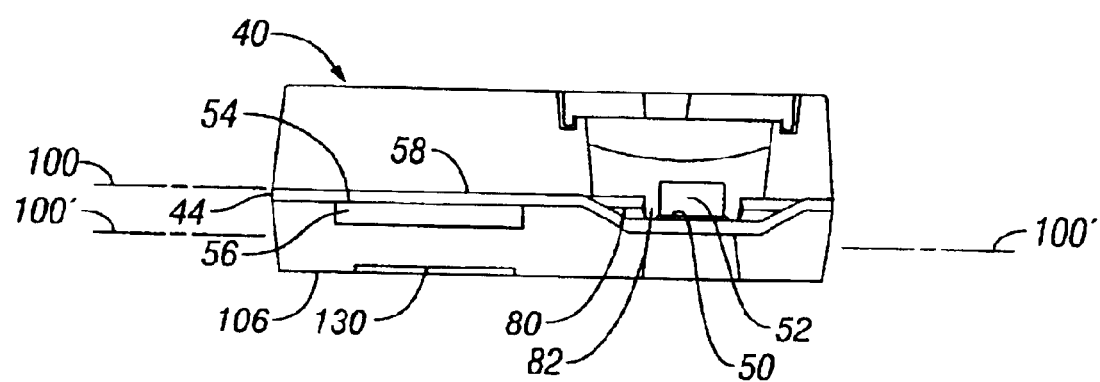
FIG. 8 is a sectional drawing illustrating an alternative arrangement for mounting the ASIC on a lower surface of the leadframe.

In FIG. 6 the large opening 130 to the left is a bottom ejector pin mark, to be used for releasing out the packaged body from the mold die after completion of the molding process. The four holes 84 are fixture holes which are clamped/pinched by opposed pinching pins, not shown, which maintains cleanliness of the sensor wirebond leads. The hole 82 is a fixture hole as well formed by pinching pins, (not shown) in the same way as the holes. The hole 82 is for clamping the sensor die pad which is regressed (i.e. downset) from the main leadframe line.

After molding, the encapsulating gel sealant 86 is deposited in the chamber 78 over the sensor 50 and the apertured cover 18 is installed in the opening, the package is then singulated. It should be understood that if an additional ASIC or additional sensor is desired, that the arrangement of the invention may be employed to incorporate multiple chips within a single package.

While there has been described what at present is considered to be an exemplary embodiment of the invention, it will be apparent to those skilled in the art that various changes and modifications may be made therein without departing from the invention, and it is intended in the accompanying claims to cover such changes and modifications as fall within the true spirit and scope of the invention.

What is claimed is:

1. A surface mount package for a multi-chip device comprising:

a leadframe having a first and a second die pad and leadouts from the respective die pads;

at least one environmentally responsive sensor chip secured to the first die pad of the leadframe;

at least one environmentally isolated chip secured to the second die pad of the leadframe, the leadframe being coupled between the chips for establishing communication therebetween;

a body including an over molded portion for encasing the environmentally isolated chip and a portion of the leadframe; and an open molded portion having a recess formed with an opening for receiving the environmentally sensitive chip therein; and an apertured cover secured in the recess forming a protective covering over the sensor chip and for allowing communication of the sensor chip externally of the package.

2. The surface mount package of claim 1, further including a protective material disposed in the recess for covering the sensor chip.

3. The surface mount package of claim 2, wherein the protective material comprises a silicone gel.

4. The surface mount package of claim 1, wherein the first and second die pads comprise planar areas disposed in parallel planes, such that the isolated chip and the sensor chip are disposed for minimizing a thickness of the body.

5. The surface mount package of claim 1, wherein the body has marginal sides, and a top and a bottom surface in parallel planes, and the leadframe includes readouts extending beyond the marginal sides and having distal end portions lying in a plane adjacent to and parallel with the bottom surface.

* * * * *